(12) United States Patent
Liao et al.

(10) Patent No.: US 8,309,467 B2
(45) Date of Patent: Nov. 13, 2012

(54) MANUFACTURING METHOD OF DEVICE AND PLANARIZATION PROCESS

(75) Inventors: Chien-Mao Liao, Taipei County (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 209 days.

(21) Appl. No.: 12/962,666

(22) Filed: Dec. 8, 2010

(65) Prior Publication Data

US 2012/0149197 A1 Jun. 14, 2012

(51) Int. Cl.
*H01L 21/306* (2006.01)
*B44C 1/22* (2006.01)

(52) U.S. Cl. ............ 438/692; 216/88; 216/89; 438/691; 438/693

(58) Field of Classification Search .................. 438/691, 438/692, 693; 216/88, 89
See application file for complete search history.

(56) References Cited

U.S. PATENT DOCUMENTS

| 7,074,690 | B1 * | 7/2006 | Gauri et al. | 438/428 |
|---|---|---|---|---|
| 2004/0183203 | A1 * | 9/2004 | Meagley et al. | 257/774 |
| 2004/0248375 | A1 * | 12/2004 | McNeil et al. | 438/435 |
| 2006/0105553 | A1 * | 5/2006 | Wellhausen | 438/526 |
| 2010/0035404 | A1 * | 2/2010 | Li | 438/424 |

* cited by examiner

*Primary Examiner* — Shamim Ahmed
(74) *Attorney, Agent, or Firm* — Jianq Chyun IP Office

(57) ABSTRACT

A manufacturing method of a device is provided. In the manufacturing method, a substrate is provided. The substrate has a plurality of patterns and a plurality of openings formed thereon, and the openings are located among the patterns. A first liquid supporting layer is formed on the patterns, and the openings are filled with the first liquid supporting layer. The first liquid supporting layer is transformed into a first solid supporting layer. The first solid supporting layer includes a plurality of supporting elements formed in the openings, and the supporting elements are formed among the patterns. A treatment process is performed on the patterns. The first solid supporting layer that includes the supporting elements is transformed into a second liquid supporting layer. The second liquid supporting layer is removed.

20 Claims, 6 Drawing Sheets

MANUFACTURING METHOD OF DEVICE AND PLANARIZATION PROCESS

BACKGROUND OF THE INVENTION

1. Field of the Invention

The invention relates to a manufacturing method of a device and a planarization process. More particularly, the invention relates to a manufacturing method of a device having a supporting layer and a planarization process.

2. Description of Related Art

With continuous reduction of the device size, the exposure light resolution for photolithography is increased. As the depth of the exposure light is reduced, the requirement for the varying degree of altitude of a wafer surface has become rather strict. Hence, when the manufacturing process is reduced to deep sub-micron, the planarization of the wafer is accomplished by performing a chemical mechanical polishing (CMP) process or an etch back process. The CMP process or the etch back process, due to its anisotropic polishing properties, can be applied to planarization the profile of the wafer surface, fabrication of vertical or horizontal metal interconnect in damascene structures, fabrication of shallow trench isolation (STI) devices and fabrication of advance devices in the first manufacturing stage, planarization of micro-electromechanical systems, fabrication of flat panel displays, and so on.

In general, when the CMP process and the etch back process are performed on the device having the undulated surface, a supporting layer is formed on the device. Openings formed on the undulated surface of the device are filled with the supporting layer, and a planarization process is performed on the supporting layer and the device, such that the device can have a planar surface. The remaining supporting layer is then removed. Here, the gap-fill capacity of the supporting layer poses an impact on the effects of the planarization process. Besides, the removal of the supporting layer complicates the planarization process.

SUMMARY OF THE INVENTION

The invention is directed to a manufacturing method of a device. By applying the manufacturing method, the device can be supported by a supporting layer during treatment.

The invention is further directed to a planarization process which has simple steps.

The invention provides a manufacturing method of a device. In the manufacturing method, a substrate is provided. The substrate has a plurality of patterns and a plurality of openings farmed thereon, and the openings are located among the patterns. A first liquid supporting layer is formed on the patterns, and the openings are filled with the first liquid supporting layer. The first liquid supporting layer is transformed into a first solid supporting layer. The first solid supporting layer includes a plurality of supporting elements formed in the openings, and the supporting elements are formed among the patterns. A treatment process is performed on the patterns. The first solid supporting layer that includes the supporting elements is transformed into a second liquid supporting layer. The second liquid supporting layer is removed.

According to an embodiment of the invention, the first liquid supporting layer includes absolute liquid.

According to an embodiment of the invention, the first liquid supporting layer has a phase change temperature.

According to an embodiment of the invention, a method of transforming the first liquid supporting layer into the first solid supporting layer includes lowering a temperature of the first liquid supporting layer below the phase change temperature.

According to an embodiment of the invention, a method of transforming the first solid supporting layer into the second liquid supporting layer includes raising a temperature of the first solid supporting layer above the phase change temperature.

According to an embodiment of the invention, the treatment process includes removing a portion of the patterns.

According to an embodiment of the invention, the treatment process further includes removing a portion of the supporting elements.

According to an embodiment of the invention, the treatment process includes performing a planarization process.

According to an embodiment of the invention, the planarization process includes a chemical mechanical polishing process or an etch back process.

According to an embodiment of the invention, a method of removing the second liquid supporting layer includes performing a drying process.

According to an embodiment of the invention, a height-to-width ratio of the openings is greater than 30:1.

The invention further provides a planarization process. In the planarization process, a substrate is provided. The substrate has a plurality of patterns and a plurality of openings formed thereon, and the openings are located among the patterns, and the patterns have different heights. A first liquid supporting layer is formed on the patterns, and the openings are filled with the first liquid supporting layer. The first liquid supporting layer covers the patterns. The first liquid supporting layer is transformed into a first solid supporting layer. The first solid supporting layer includes a plurality of supporting elements formed in the openings, and the supporting elements are located among the patterns. A planarization step is performed on the first solid supporting layer and the patterns, such that the supporting elements and the patterns have the same height and a planar surface. The first solid supporting layer that includes the supporting elements is transformed into a second liquid supporting layer. The second liquid supporting layer is removed.

According to an embodiment of the invention, the first liquid supporting layer is absolute liquid.

According to an embodiment of the invention, the first liquid supporting layer has a phase change temperature.

According to an embodiment of the invention, a method of transforming the first liquid supporting layer into the first solid supporting layer includes lowering a temperature of the first liquid supporting layer below the phase change temperature.

According to an embodiment of the invention, a method of transforming the first solid supporting layer into the second liquid supporting layer includes raising a temperature of the first solid supporting layer above the phase change temperature.

According to an embodiment of the invention, the planarization step includes a chemical mechanical polishing process or an etch back process.

According to an embodiment of the invention, the planarization step includes setting one of the patterns having the minimum height as a destination of planarization.

According to an embodiment of the invention, a method of removing the second liquid supporting layer includes performing a drying process.

According to an embodiment of the invention, a height-to-width ratio of the openings is greater than 30:1.

Based on the above, in the manufacturing method of the device and the planarization process, a material of the supporting layer is capable of making a phase change between the liquid phase and the solid phase. The liquid supporting layer is apt to be formed and removed, while the solid supporting layer can well support the patterns. Hence, the manufacturing method of the device and the planarization process of the invention have favorable efficiency and simple steps.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1A:
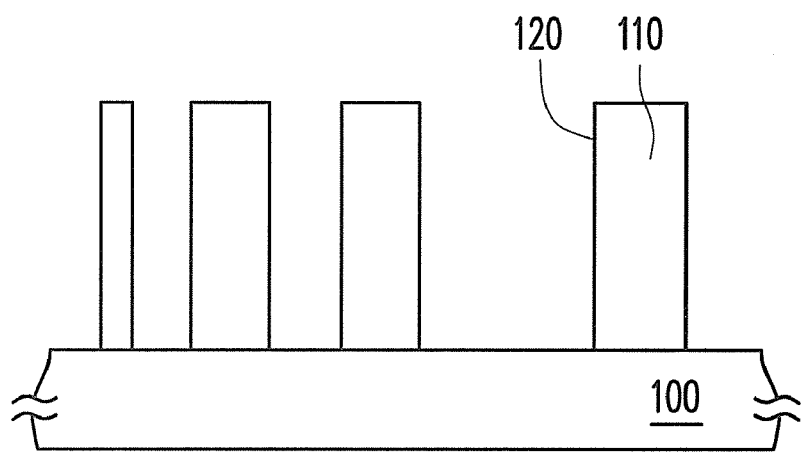
FIG. 1A to FIG. 1F are schematic cross-sectional views illustrating a manufacturing method of a device according to an embodiment of the invention.

FIG. 1A to FIG. 1F are schematic cross-sectional views illustrating a manufacturing method of a device according to an embodiment of the invention. With reference to FIG. 1A, in the manufacturing method, a substrate 100 is provided. The substrate 100 has a plurality of patterns 110 and a plurality of openings 120 formed thereon and the openings 120 are located among the patterns 110. The substrate 100 of this embodiment is a silicon wafer, for instance. The patterns 110 are made of an insulating material or a conductive material, for instance. Besides, the patterns 110 have the same height, for instance. The openings 120 have a high height-to-width ratio, e.g., the height-to-width ratio is greater than 30:1. The patterns 110 of this embodiment exemplarily have the same height, while the patterns 110 in other embodiments of the invention can certainly have different heights.

Figure 1B:
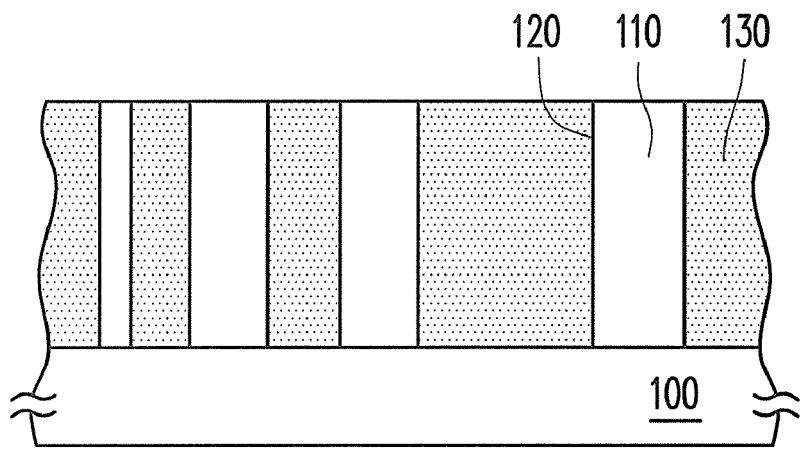

With reference to FIG. 1B, a first liquid supporting layer 130 is formed on the patterns 110, and the openings 120 are filled with the first liquid supporting layer 130. In this embodiment, the first liquid supporting layer 130 is made of absolute liquid, for instance. Additionally, the first liquid supporting layer 130 has a phase change temperature that ranges from −15° C. to 20° C., for instance. That is to say, the first liquid supporting layer 130 of this embodiment exists in the liquid form at a temperature higher than the phase change temperature, while the first liquid supporting layer 130 of this embodiment exists in the solid form at a temperature lower than the phase change temperature. It should be mentioned that the openings 120 are filled with the first liquid supporting layer 130 in the liquid form in this step, and therefore the first liquid supporting layer 130 is characterized by favorable flowability and satisfactory gap-filling capacity.

Figure 1C:
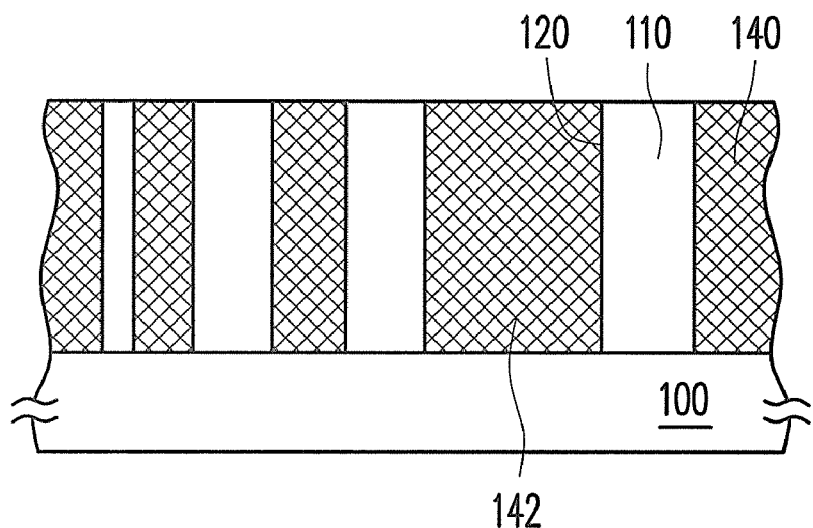

With reference to FIG. 1C, the first liquid supporting layer 130 is transformed into a first solid supporting layer 140. The first solid supporting layer 140 includes a plurality of supporting elements 142 formed in the openings 120, and the supporting elements 142 are formed among the patterns 110. According to this embodiment, a method of transforming the first liquid supporting layer 130 into the first solid supporting layer 140 includes lowering a temperature of the first liquid supporting layer 130 below the phase change temperature, for instance. Namely, in this step, the first liquid supporting layer 130 filling the openings 120 is transformed into the supporting elements 142 that are respectively located in the openings 120. The supporting elements 142 are located among the patterns 110, so as to well support the patterns 110.

Figure 1D:
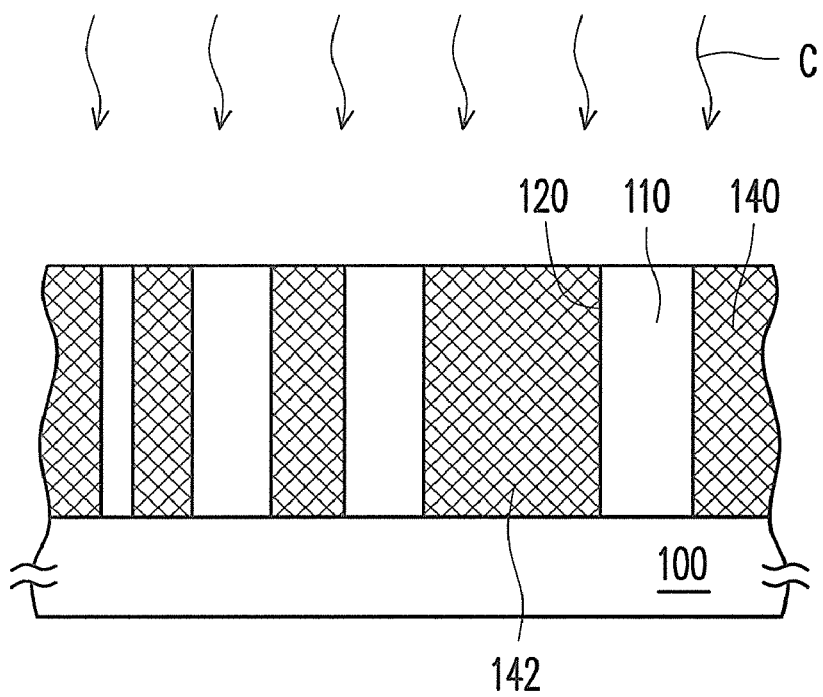

With reference to FIG. 1D, a treatment process C is performed on the patterns 110. The treatment process C is a planarization process, supporting functional process, dummy fill process, and so on. Here, the planarization process is a CMP process or an etch back process, for instance. In the treatment process C of this embodiment, a portion of the patterns 110 and a portion of the supporting elements 142 are removed, for instance. Generally, when the treatment process C (e.g., the planarization process, supporting functional process, dummy fill process, and so on) is performed on the patterns 110 that have the high height-to-width ratio, structural collapse or structural instability may occur. However, in this embodiment, the supporting elements 142 can well support the patterns 110, such that the patterns 110 on which the treatment process C is performed can have stable structures.

Figure 1E:
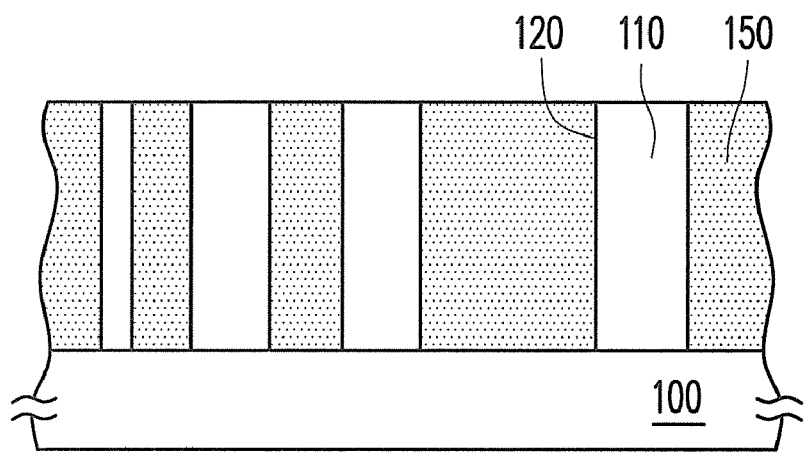

With reference to FIG. 1E, the first solid supporting layer 140 that includes the supporting elements 142 is transformed into a second liquid supporting layer 150. According to this embodiment, a method of transforming the first solid supporting layer 140 into the second liquid supporting layer 150 includes raising a temperature of the first solid supporting layer 140 above the phase change temperature, for instance. That is to say, in this step, the supporting elements 142 are transformed into the second liquid supporting layer 150 that is characterized by flowability.

Figure 1F:
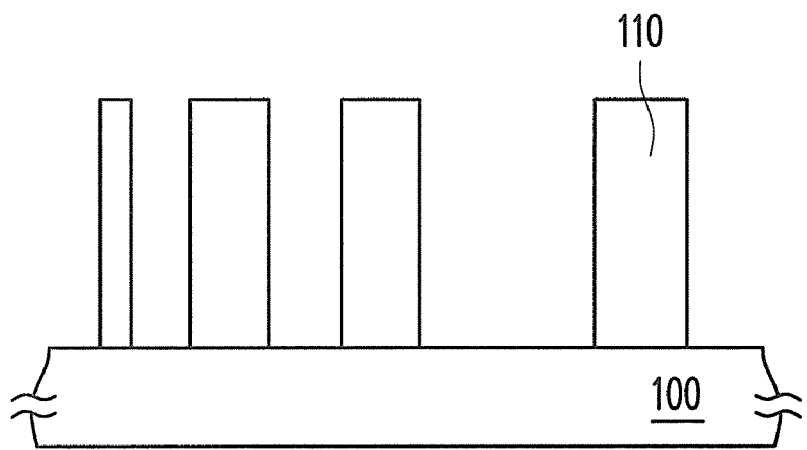

With reference to FIG. 1F, the second liquid supporting layer 150 is then removed. In this embodiment, a method of removing the second liquid supporting layer 150 includes performing a drying process, for example. Particularly, in this step, the temperature of the second liquid supporting layer 150 is raised to a certain degree, such that the second liquid supporting layer 150 is gasified (e.g., evaporated, volatilized, and so on). As such, the second liquid supporting layer 150 disposed among the patterns 110 can be completely removed with ease, and no residual second liquid supporting layer 150 is left among the patterns 110.

According to the manufacturing method of the device in this embodiment, the supporting layer disposed among the patterns is made of a material that can make a phase change between the liquid phase and the solid phase. First of all, the liquid supporting layer 130 is formed among the patterns 110. Here, the liquid supporting layer 130 characterized by favorable gap-filling capacity and satisfactory adhesion can be formed in the openings 120 that are located among the patterns 110. The liquid supporting layer 130 is then transformed into the solid supporting layer 140. Thereby, the solid supporting layer 140 that includes the supporting elements 142 can well support the patterns 110, which is conducive to subsequent implementation of various treatment processes on the patterns 110. After the treatment process is completely performed on the patterns 110, the solid supporting layer 140 is transformed into the liquid supporting layer 150, so as to easily remove the liquid supporting layer 150. In other words, the transformation of the supporting layer between the liquid phase and the solid phase ensures that the patterns can be well supported. Moreover, the supporting layer transformed between the two phases can be easily removed, which can prevent contamination caused by the incomplete removal of the supporting layer. Accordingly, the manufacturing method of the device in this embodiment has favorable efficiency and simple steps. Specifically, since the supporting layer is apt to be formed and removed, temporary support can be provided to the patterns with the high height-to-width ratio based on manufacturing requirements.

Figure 2A:
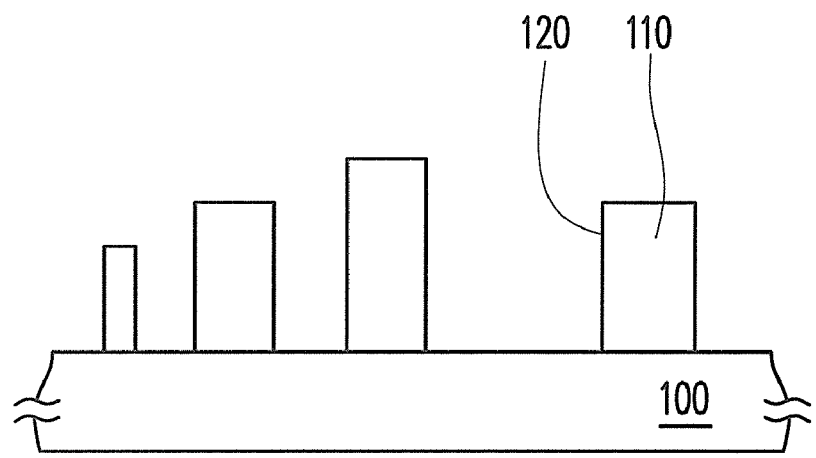
FIG. 2A to FIG. 2F are schematic cross-sectional views illustrating a planarization process according to an embodiment of the invention.

FIG. 2A to FIG. 2F are schematic cross-sectional views illustrating a planarization process according to an embodiment of the invention. With reference to FIG. 2A, in the planarization process, a substrate 100 is provided. The substrate 100 has a plurality of patterns 110 and a plurality of openings 120 formed thereon and the openings 120 are located among the patterns 110. Here, the patterns 110 have different heights. The substrate 100 of this embodiment is a silicon wafer, for instance. The patterns 110 are made of an insulating material or a conductive material, for instance. In this embodiment, the openings 120 are trenches using to form the STI structures. Besides, the openings 120 have a high height-to-width ratio, e.g., the height-to-width ratio is greater than 30:1.

Figure 2B:
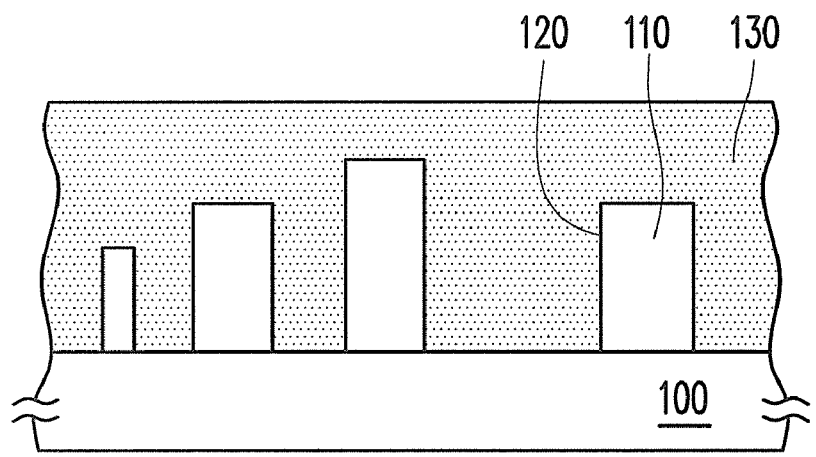

With reference to FIG. 2B, a first liquid supporting layer 130 is formed on the patterns 110, and the openings 120 are filled with the first liquid supporting layer 130. The first liquid supporting layer 130 covers the patterns 110. In this embodiment, the first liquid supporting layer 130 is made of absolute liquid, for instance. Additionally, the first liquid supporting layer 130 has a phase change temperature that ranges from −15° C. to 20° C., for instance. That is to say, the first liquid supporting layer 130 of this embodiment exists in the liquid form at a temperature higher than the phase change temperature, while the first liquid supporting layer 130 of this embodiment exists in the solid form at a temperature lower than the phase change temperature. It should be mentioned that the openings 120 are filled with the first liquid supporting layer 130 in the liquid form in this step, and therefore the first liquid supporting layer 130 is characterized by favorable flowability, great gap-filling capacity, and satisfactory adhesion.

Figure 2C:
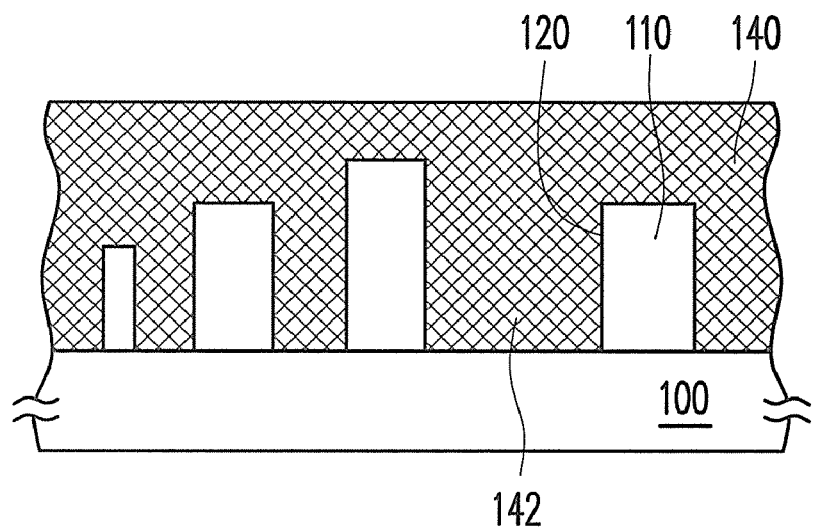

With reference to FIG. 2C, the first liquid supporting layer 130 is transformed into a first solid supporting layer 140. The first solid supporting layer 140 includes a plurality of supporting elements 142 formed in the openings 120, and the supporting elements 142 are formed among the patterns 110. According to this embodiment, a method of transforming the first liquid supporting layer 130 into the first solid supporting layer 140 includes lowering a temperature of the first liquid supporting layer 130 below the phase change temperature, for instance. Namely, in this step, the first liquid supporting layer 130 filling the openings 120 is transformed into the supporting elements 142 that are respectively located in the openings 120. The supporting elements 142 are located among the patterns 110, so as to well support the patterns 110.

Figure 2D:
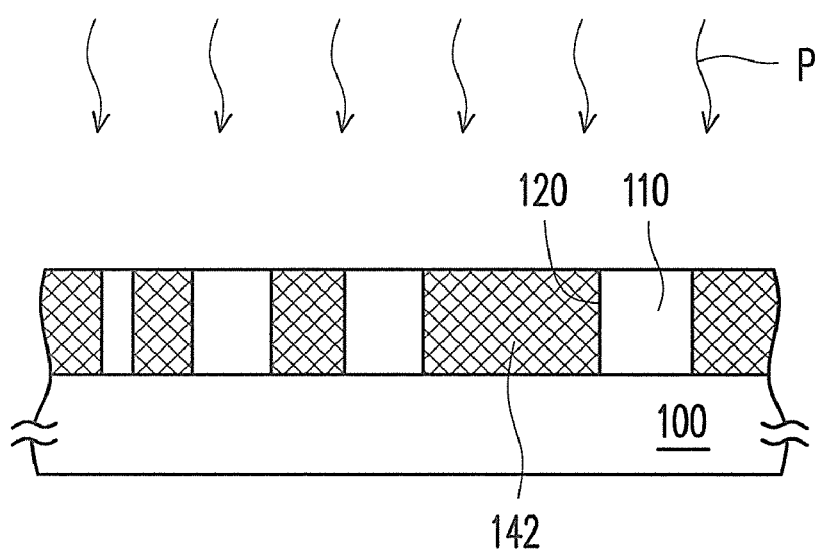

With reference to FIG. 2D, a planarization step P is then performed on the patterns 110, such that the supporting elements 142 and the patterns 110 have the same height and a planar surface. In this embodiment, the planarization step P is a CMP process or an etch back process, for instance. To be more specific, in this embodiment, the planarization step P is performed on the patterns 110 and the supporting elements 142. The planarization step includes setting one of the patterns 110 having the minimum height as a destination of planarization. Thereby, the supporting elements 142 and the patterns 110 have the same height and a planar surface.

Figure 2E:
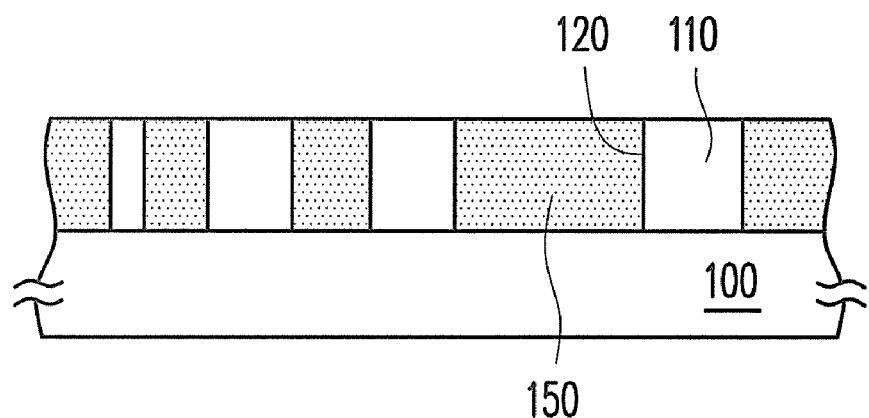

With reference to FIG. 2E, the first solid supporting layer 140 that includes the supporting elements 142 is transformed into a second liquid supporting layer 150. According to this embodiment, a method of transforming the first solid supporting layer 140 into the second liquid supporting layer 150 includes raising a temperature of the first solid supporting layer 140 above the phase change temperature, for instance. That is to say, in this step, the supporting elements 142 are transformed into the second liquid supporting layer 150 that is characterized by flowability.

Figure 2F:
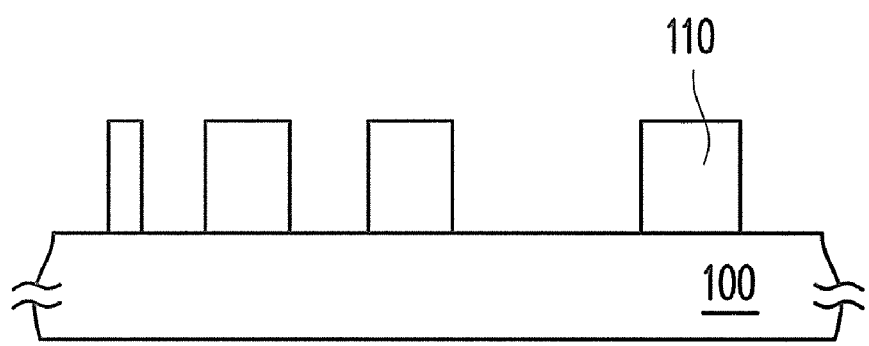

With reference to FIG. 2F, the second liquid supporting layer 150 is then removed. In this embodiment, a method of removing the second liquid supporting layer 150 includes performing a drying process, for example. Particularly, in this step, the temperature of the second liquid supporting layer 150 is raised to a certain degree, such that the second liquid supporting layer 150 is gasified (e.g., evaporated, volatilized, and so on). As such, the second liquid supporting layer 150 disposed among the patterns 110 can be completely removed with ease, and no residual second liquid supporting layer 150 is left among the patterns 110.

In the planarization process of this embodiment, the supporting layer disposed among the patterns is made of a material that can make a phase change between the liquid phase and the solid phase. The liquid supporting layer 130 is formed among the patterns 110. Here, the liquid supporting layer 130 characterized by favorable gap-filling capacity and satisfactory adhesion can be formed in the openings 120 that are located among the patterns 110. The liquid supporting layer 130 is then transformed into the solid supporting layer 140. Thereby, the solid supporting layer 140 that includes the supporting elements 142 can well support the patterns 110, which is conducive to subsequent implementation of various treatment processes (e.g., the CMP process, the etch back process, and so forth) on the patterns 110. The solid supporting layer 140 is then transformed into the liquid supporting layer 150, so as to easily remove the liquid supporting layer 150. In other words, the transformation of the supporting layer between the liquid phase and the solid phase ensures that the patterns on which the planarization process is performed can be well supported. Moreover, the supporting layer transformed between the two phases can be easily removed, which can prevent contamination caused by the incomplete removal of the supporting layer. More particularly, the supporting layer has favorable gap-filling capacity and satisfactory adhesion, and therefore the planarization process of this embodiment is applicable to the patterns having the high height-to-width ratio. Further, the planarization process of this embodiment has great efficiency and simple steps.

In light of the foregoing, according to the manufacturing method of the device and the planarization process in the invention, the material of the supporting layer is capable of making a phase change between the liquid phase and the solid phase. Here, the supporting layer is formed and removed when the supporting layer is in the liquid form, while the supporting layer in the solid form can well support the patterns. Hence, the supporting layer characterized by favorable gap-filling capacity and satisfactory adhesion can well support the patterns on which the treatment process or the planarization process is performed. Subsequently, the supporting layer can be completely removed by performing a simple process, e.g., a drying process. Note that the formation and removal of the supporting layer can be achieved by adjusting the temperature and can be effortlessly integrated with the current manufacturing process without significantly increasing the manufacturing costs. Namely, the two-phase property of the supporting layer not only substantially improves the efficiency of the manufacturing method of the device and the planarization process but also simplifies the steps in the manufacturing method of the device and the planarization process.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a device, comprising:
providing a substrate, the substrate having a plurality of patterns and a plurality of openings formed thereon, the openings being located among the patterns;
forming a first liquid supporting layer on the patterns, the openings being filled with the first liquid supporting layer;
transforming the first liquid supporting layer into a first solid supporting layer, the first solid supporting layer comprising a plurality of supporting elements formed in the openings, the supporting elements being formed among the patterns;
performing a treatment process on the patterns;
transforming the first solid supporting layer comprising the supporting elements into a second liquid supporting layer; and
removing the second liquid supporting layer.

2. The manufacturing method as claimed in claim 1, wherein the first liquid supporting layer comprises absolute liquid.

3. The manufacturing method as claimed in claim 1, wherein the first liquid supporting layer has a phase change temperature.

4. The manufacturing method as claimed in claim 3, wherein a method of transforming the first liquid supporting layer into the first solid supporting layer comprises lowering a temperature of the first liquid supporting layer below the phase change temperature.

5. The manufacturing method as claimed in claim 3, wherein a method of transforming the first solid supporting layer into the second liquid supporting layer comprises raising a temperature of the first solid supporting layer above the phase change temperature.

6. The manufacturing method as claimed in claim 1, wherein the treatment process comprises removing a portion of the patterns.

7. The manufacturing method as claimed in claim 6, wherein the treatment process further comprises removing a portion of the supporting elements.

8. The manufacturing method as claimed in claim 1, wherein the treatment process comprises performing a planarization process.

9. The manufacturing method as claimed in claim 8, wherein the planarization process comprises a chemical mechanical polishing process or an etch back process.

10. The manufacturing method as claimed in claim 1, wherein a method of removing the second liquid supporting layer comprises performing a drying process.

11. The manufacturing method as claimed in claim 1, wherein a height-to-width ratio of the openings is greater than 30:1.

12. A planarization process comprising:
providing a substrate, the substrate having a plurality of patterns and a plurality of openings formed on the substrate, the openings being located among the patterns, wherein the patterns have different heights;
forming a first liquid supporting layer on the patterns, the openings being filled with the first liquid supporting layer, the first liquid supporting layer covering the patterns;
transforming the first liquid supporting layer into a first solid supporting layer, the first solid supporting layer comprising a plurality of supporting elements formed in the openings, the supporting elements being located among the patterns;
performing a planarization step on the first solid supporting layer and the patterns, such that the supporting elements and the patterns have a same height and a planar surface;
transforming the first solid supporting layer comprising the supporting elements into a second liquid supporting layer; and
removing the second liquid supporting layer.

13. The planarization process as claimed in claim 12, wherein the first liquid supporting layer is absolute liquid.

14. The planarization process as claimed in claim 12, wherein the first liquid supporting layer has a phase change temperature.

15. The planarization process as claimed in claim 14, wherein a method of transforming the first liquid supporting layer into the first solid supporting layer comprises lowering a temperature of the first liquid supporting layer below the phase change temperature.

16. The planarization process as claimed in claim 14, wherein a method of transforming the first solid supporting layer into the second liquid supporting layer comprises raising a temperature of the first solid supporting layer above the phase change temperature.

17. The planarization process as claimed in claim 12, wherein the planarization step comprises a chemical mechanical polishing process or an etch back process.

18. The planarization process as claimed in claim 12, wherein the planarization step comprises setting one of the patterns having a minimum height as a destination of planarization.

19. The planarization process as claimed in claim 12, wherein a method of removing the second liquid supporting layer comprises a drying process.

20. The planarization process as claimed in claim 12, wherein a height-to-width ratio of the openings is greater than 30:1.

* * * * *